US007958842B2

(12) United States Patent
Ogawa et al.

(10) Patent No.: US 7,958,842 B2
(45) Date of Patent: Jun. 14, 2011

(54) SUBSTRATE PROCESSING APPARATUS

(75) Inventors: Shizue Ogawa, Toyama (JP); Kazuyuki Toyoda, Toyama (JP); Motonari Takebayashi, Toyama (JP); Tadashi Kontani, Toyama (JP); Nobuo Ishimaru, Takaoka (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 911 days.

(21) Appl. No.: 10/571,898

(22) PCT Filed: Feb. 16, 2005

(86) PCT No.: PCT/JP2005/002306
§ 371 (c)(1),
(2), (4) Date: Oct. 15, 2007

(87) PCT Pub. No.: WO2005/083766
PCT Pub. Date: Sep. 9, 2005

(65) Prior Publication Data
US 2008/0153308 A1 Jun. 26, 2008

(30) Foreign Application Priority Data
Feb. 27, 2004 (JP) ................. 2004-055446

(51) Int. Cl.
C23C 16/00 (2006.01)
(52) U.S. Cl. ...... 118/723 E; 257/E21.091; 257/E21.462
(58) Field of Classification Search ............ 438/758; 118/732 R, 723 E; 257/E21.091, E21.462; 73/1.58, 864.35; 156/345.4–345.48
See application file for complete search history.

(56) References Cited

U.S. PATENT DOCUMENTS

| 4,431,473 A | * | 2/1984 | Okano et al. ............. 156/345.31 |
| 6,490,144 B1 | * | 12/2002 | Narendrnath et al. ........ 361/234 |
| 6,971,391 B1 | * | 12/2005 | Wang et al. ................... 128/846 |
| 2003/0164143 A1 | | 9/2003 | Toyoda et al. | |
| 2004/0025786 A1 | | 2/2004 | Kontani et al. | |

FOREIGN PATENT DOCUMENTS

| JP | 5-160042 A | | 6/1993 |
| JP | 2002-280378 | * | 9/2002 |
| JP | 2002-280378 A | | 9/2002 |
| JP | 2002-324760 A | | 11/2002 |
| JP | 2003-297818 A | | 10/2003 |
| JP | 2004-124234 A | | 4/2004 |

* cited by examiner

Primary Examiner — Tom Thomas
Assistant Examiner — Monica D Harrison
(74) Attorney, Agent, or Firm — Birch, Stewart, Kolasch & Birch, LLP

(57) ABSTRACT

A substrate processing apparatus comprising: a processing chamber which is to accommodate at least one substrate; a gas supply system which is to supply processing gas into the processing chamber; an exhaust system which is to exhaust atmosphere in the processing chamber; and at least one pair of electrodes which are to bring the processing gas into an active state and which are accommodated in protection tubes such that the electrodes can be inserted into and pulled out from the protection tubes, wherein the electrodes are accommodated in the protection tube in a state where at least a portion of the electrodes is bent, and the electrodes are formed of flexible members, is disclosed.

14 Claims, 8 Drawing Sheets

SUBSTRATE PROCESSING APPARATUS

TECHNICAL FIELD

The present invention relates to a substrate processing apparatus, and more particularly, to a substrate processing apparatus which forms a film on a semiconductor wafer using plasma-excited processing gas.

As the substrate processing apparatus which forms a film on the semiconductor wafer using plasma-excited processing gas, there is an apparatus in which an electrode which generates plasma is accommodated in a protection tube so as to avoid reaction with respect to the processing gas (see Japanese Patent Application Publication Laid-open No. 2002-280378).

The present inventors have found that the substrate processing apparatus having such a structure could generate plasma equally, and an electrode having such a structure that the electrode could easily be attached to the apparatus was preferable.

Hence, it is a main object of the present invention to provide a substrate processing apparatus which can equally generate plasma and which has an electrode of such a structure that the electrode can easily be attached to the apparatus.

According to one aspect of the present invention, there is provided a substrate processing apparatus, comprising a processing chamber which is to accommodate at least one substrate, a gas supply system which is to supply processing gas into the processing chamber, an exhaust system which is to exhaust atmosphere in the processing chamber, and at least one pair of electrodes which are to bring the processing gas into an active state and which are accommodated in protection tubes such that the electrodes can be inserted into and pulled out from the protection tubes, wherein the electrodes are accommodated in the protection tube in a state where at least a portion of the electrodes is bent, and the electrodes are formed of flexible members.

According to another aspect of the present invention, there is provided a semiconductor device producing method, comprising processing a substrate using a substrate processing apparatus, comprising a processing chamber which is to accommodate at least one substrate, a gas supply system which is to supply processing gas into the processing chamber, an exhaust system which is to exhaust atmosphere in the processing chamber, and at least one pair of electrodes which are to bring the processing gas into an active state and which are accommodated in protection tubes such that the electrodes can be inserted into and pulled out from the protection tubes, wherein the electrodes are accommodated in the protection tube in a state where at least a portion of the electrodes is bent, and the electrodes are formed of flexible members.

BRIEF DESCRIPTION OF THE FIGURES IN THE DRAWINGS

PREFERABLE MODE FOR CARRYING OUT THE INVENTION

Figure 1:
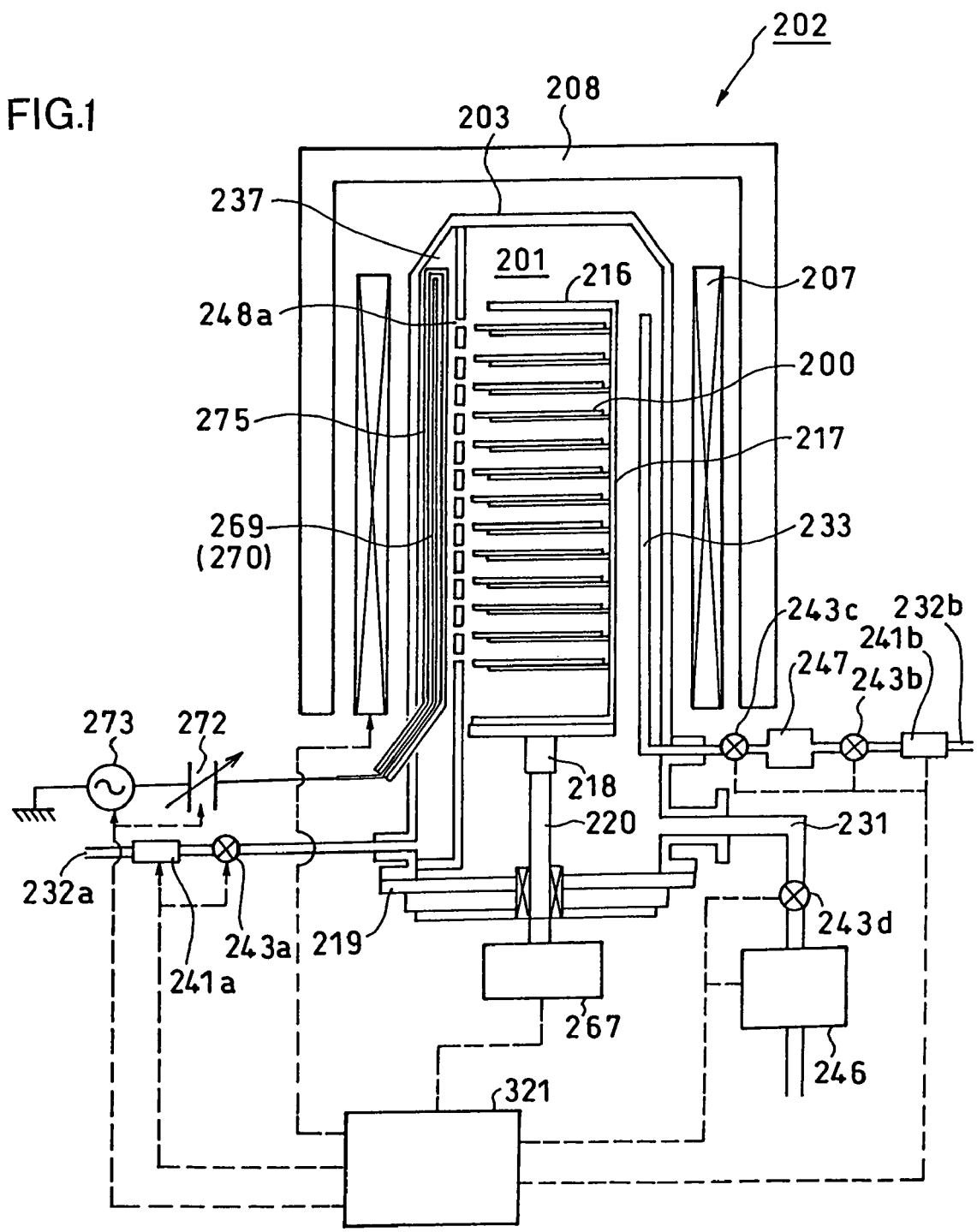
FIG. 1 is a schematic longitudinal sectional view for explaining a vertical substrate processing furnace of a substrate processing apparatus according to a first embodiment of the present invention.

According to a preferred embodiment of the present invention, there is provided a substrate processing apparatus, comprising a processing chamber which is to accommodate at least one substrate, a gas supply system which is to supply processing gas into the processing chamber, an exhaust system which is to exhaust atmosphere in the processing chamber, and at least one pair of electrodes which are to bring the processing gas into an active state and which are accommodated in protection tubes such that the electrodes can be inserted into and pulled out from the protection tubes, wherein the electrodes are accommodated in the protection tube in a state where at least a portion of the electrodes is bent, and the electrodes are formed of flexible members.

Preferably, the electrodes are formed by weaving linear conductive members. More preferably, the electrode are provided with cores.

Preferably, the electrodes are of a hollow cylindrical shape formed by weaving linear conductive members.

Preferably, the electrode are formed by tying linear conductive members in a bundle.

Preferably, the pair of electrodes are accommodated in separate protection tubes, respectively, such that the electrodes can be inserted into and pulled out from the protection tubes, respectively.

Preferably, an outer diameter of each of the pair of electrodes is smaller than an inner diameter of each of the separate protection tubes by 1 mm to 2 mm.

Preferably, the substrate processing apparatus is an apparatus wherein processing of the substrates are carried out in a state where a substrate holding member which holds a plurality of substrates in a multi-stacked manner at a predetermined distance from each other is accommodated in the processing chamber, and the pair of electrodes are disposed along a stacking direction of the substrates, and ends of the electrodes are located at a position exceeding a position of a leading end substrate, which is held by the substrate holding member which is located on the side of the ends of the electrodes, by at least a length corresponding to the distance between adjacent substrates in the substrate holding member.

In this case, more preferably, the ends of the electrodes are located at a position exceeding a position of a top plate of the substrate holding member.

According to a preferred embodiment of the present invention, there is provided a semiconductor device producing method, comprising a step of processing a substrate using a substrate processing apparatus, comprising a processing chamber which is to accommodate at least one substrate, a gas supply system which is to supply processing gas into the processing chamber, an exhaust system which is to exhaust atmosphere in the processing chamber, and at least one pair of electrodes which are to bring the processing gas into an active state and which are accommodated in protection tubes such that the electrodes can be inserted into and pulled out from the protection tubes, wherein the electrodes are accommodated in the protection tube in a state where at least a portion of the electrodes is bent, and the electrodes are formed of flexible members.

Next, a preferable embodiment of the present invention will be explained.

In the preferable embodiment of the invention, an electrode which generates plasma is accommodated in a protection tube in a state where at least a portion of the electrode is bent, and the electrode is formed of flexible member.

If the electrode is flexible, the electrode has elasticity when it is inserted into the protection tube, and thermal expansion can be suppressed. Even when a thin and long electrode is used for discharging electricity equally in a reaction chamber from a lower portion to an upper portion therein, the electrode can easily be attached to and detached from the protection tube.

If the electrode which generates plasma is formed by weaving linear conductive members, a freedom degree when the electrode is inserted can be increased, and deformation caused by thermal expansion can be reduced. Further, a surface area can be secured, and high frequency has characteristics that it flows on a surface of an object and thus, plasma can efficiently be generated. Especially if the electrode is formed into a cylindrical shape, further excellent effect can be obtained.

Since the electrodes for generating plasma are provided with the cores, the flexible electrodes can be used without shrinkage, and further equal plasma can be supplied to the plurality of wafers.

It is also preferable that each of the electrodes generating plasma comprises a member formed by tying linear conductive members in a bundle. With this, it is possible to easily realize a thin and long flexible electrode having a rounded cross section.

Examples of material of the conductive member are iron, nickel, carbon, gold of compound thereof. Among them, nickel is preferably used if heat resistance, metal contamination and cost are taken into account.

When the conductive member is used at a high temperature atmosphere higher than 500° C., carbon fiber and refractory metal such as tungsten and molybdenum are preferably used also.

First Embodiment

Next, an embodiment of the present invention will be explained in detail with reference to the drawings.

As the embodiment, film forming processing using ALD (Atomic Layer Deposition) will be explained briefly as an example of process processing carried out on a substrate such as a wafer.

The ALD method is a technique for forming a film in such a manner that two (or more) kinds of raw material gases used for forming the film are alternately supplied onto a substrate one kind by one kind under a certain condition (temperature, time or the like), the gases adsorb on the substrate one atom layer by one atom layer, and the film is formed utilizing a surface reaction.

That is, concerning chemical reaction to be utilized, when an SiN (silicon nitride) film is to be formed, in the ALD method, DCS ($SiH_2Cl_2$, dichlorosilane) and $NH_3$ (ammonia) are used, a high quality film can be formed at a lower temperature of 300 to 600° C. As raw material gases required for forming a film, a plurality kinds of reaction gases are supplied alternately one kind by one kind. The thickness of the film is controlled by the number of cycles of reaction gas supplying operations (if film forming speed is 1 Å/one cycle, and if a film of 20 Å thickness is to be formed, the processing is carried out by 20 cycles).

Figure 2:
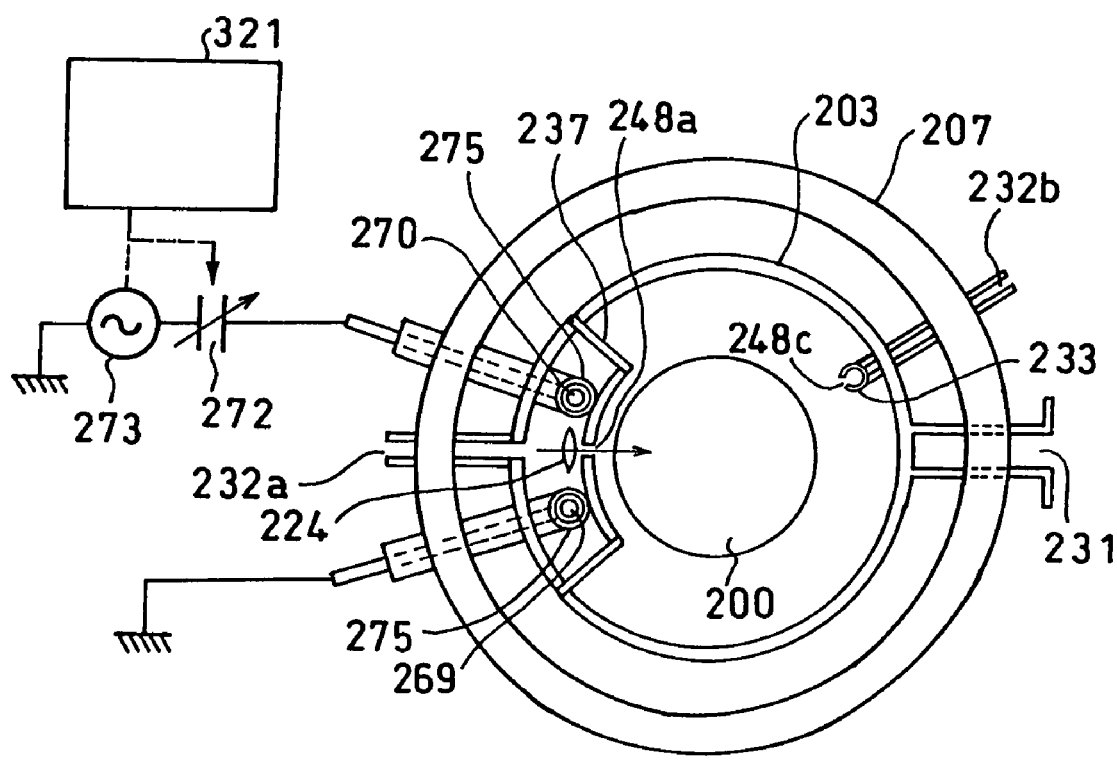
FIG. 2 is a schematic transversal sectional view for explaining the vertical substrate processing furnace of the substrate processing apparatus according to the first embodiment of the present invention.

FIG. 1 is a schematic longitudinal sectional view for explaining a vertical substrate processing furnace of a substrate processing apparatus according to a first embodiment of the present invention, and FIG. 2 is a schematic transversal sectional view for explaining the vertical substrate processing furnace of the substrate processing apparatus according to the first embodiment of the present invention.

A reaction tube 203 is provided as a reaction chamber which processes a wafer 200 which is a substrate is provided inside of a heater 207 which is heating means. A lower end opening of the reaction tube 203 is air-tightly closed with a seal cap 219 which is a lid through an O-ring (not shown) which is a hermetic member. A thermal insulating member 208 is provided outside of the reaction tube 203 and the heater 207. The thermal insulating member 208 is provided such as to cover an upper portion of the reaction tube 203 also. At least, the heater 207, the thermal insulating member 208, the reaction tube 203 and the seal cap 219 form a processing furnace 202. The reaction tube 203, the seal cap 219 and a later-described buffer chamber 237 formed in the reaction tube 203 form a processing chamber 201. A boat 217 which is a substrate-holding means is provided on the seal cap 219 in a standing attitude through a boat stage 218 and a rotation shaft 220. The boat stage 218 is a holding body which holds the boat 217. The boat 217 is inserted into a processing furnace 202. A plurality of wafers 200 to be batch-processed are placed in the boat 217 in a multi-stacked manner in their horizontal postures in an axial direction of the tube. The heater 207 heats the wafers 200 inserted into the processing furnace 202 to a predetermined temperature.

The boat 217 is provided at a central portion in the reaction tube 203. The plurality of wafers 200 are placed in the boat 217 in the multi-stacked manner in their horizontal postures at equal distances from one another. The boat 217 is brought into and out from the reaction tube 203 by a boat elevator mechanism (not shown). To enhance the equality of the processing, a boat rotation mechanism 267 which is rotation means for rotating the boat 217 is provided. The boat 217 held by the boat stage 218 is rotated by rotating the boat rotation mechanism 267.

Two gas supply pipes 232a and 232b are provided as supply pipes for supplying a plurality kinds (here, two kinds) of gases to the processing furnace 202. Reaction gas is supplied from the gas supply pipe 232a to the reaction tube 203 through a mass flow controller 241a which is flow rate control means, a valve 243a which is an open/close valve and the buffer chamber 237 formed in the reaction tube 203. Further, reaction gas is supplied from the gas supply pipe 232b to the processing chamber 201 through a mass flow controller 241b which is a flow rate control means, a valve 243b which is an open/close valve, a gas tank 247, a valve 243c which is an open/close valve, and a gas supply unit (not shown).

The processing chamber 201 is connected to a vacuum pump 246 which is exhausting means through a valve 243d and a gas exhaust pipe 231 which is an exhaust pipe for exhausting gas. The vacuum pump 246 is for the evacuation of the processing chamber 201. The evacuation of the p291 can be carried out and stopped by opening and closing the valve 243d. The valve 243d is an open/close valve which can adjust pressure by adjusting its opening degree.

A buffer chamber 237 which is a gas dispersion space is provided in an arc space between the wafers 200 and an inner wall of the reaction tube 203 constituting the processing chamber 201. The buffer chamber 237 is provided along the stacking direction of the wafers 200 from a lower portion to an upper portion of the inner wall of the reaction tube 203 near an end portion. Gas supply holes 248a which are supply holes for supplying gas are formed in an inner wall of the buffer chamber 237 which is adjacent to the wafers 200 near an end. The gas supply holes 248a are opened toward a center of the reaction tube 203. The gas supply holes 248a have the same opening areas from a lower portion to an upper portion in the stacking direction of the wafers 200 over a predetermined length, and the gas supply holes 248a are formed with the same pitch.

A gas supply pipe 232a is connected to a sidewall of the reaction tube 203 on the opposite side from the gas supply holes 248a of the buffer chamber 237.

Thin and long electrodes 269 and 270 are disposed in the buffer chamber 237 from its upper portion to lower portion. The electrodes 269 and 270 are protected by electrode protection tubes 275. One of the electrodes 269 and 270 is connected to a high frequency power supply 273 through a matching device 272, and the other electrode is grounded (reference potential). As a result, plasma is produced in a plasma producing region 224 between the electrodes 269 and 270.

The electrode protection tubes 275 can be inserted into the buffer chamber 237 in a state where the electrodes 269 and 270 are isolated from atmosphere in the buffer chamber 237.

If the atmosphere in the electrode protection tubes 275 is the same as outside air (atmosphere), the electrodes 269 and 270 inserted into the electrode protection tubes 275 are oxidized by heat of the heater 207. Hence, there is provided an inert gas purge mechanism (not shown). According to this mechanism, inert gas such as nitrogen is charged into the electrode protection tube 275 or purged, oxygen density is reduced to a sufficiently low level, thereby preventing the electrodes 269 and 270 from being oxidized.

In this embodiment, an intermediate portion of the electrode protection tube 275 is bent. Each electrode protection tube 275 comprises a vertical portion extending in the buffer chamber 237 from its portion lower than the lowermost wafer 200 to a portion higher than the boat top boat top 216, and an oblique portion extending from a lower end of the vertical portion. A lower end of the oblique portion projects outward from the sidewall of the reaction tube 203.

Flexible members are used as the electrodes 269 and 270. With this structure, the electrodes 269 and 270 can be inserted into the electrode protection tubes 275 from the lower ends of the oblique portions of the electrode protection tubes 275 and can reach the upper ends of the electrode protection tubes 275.

Figure 3:
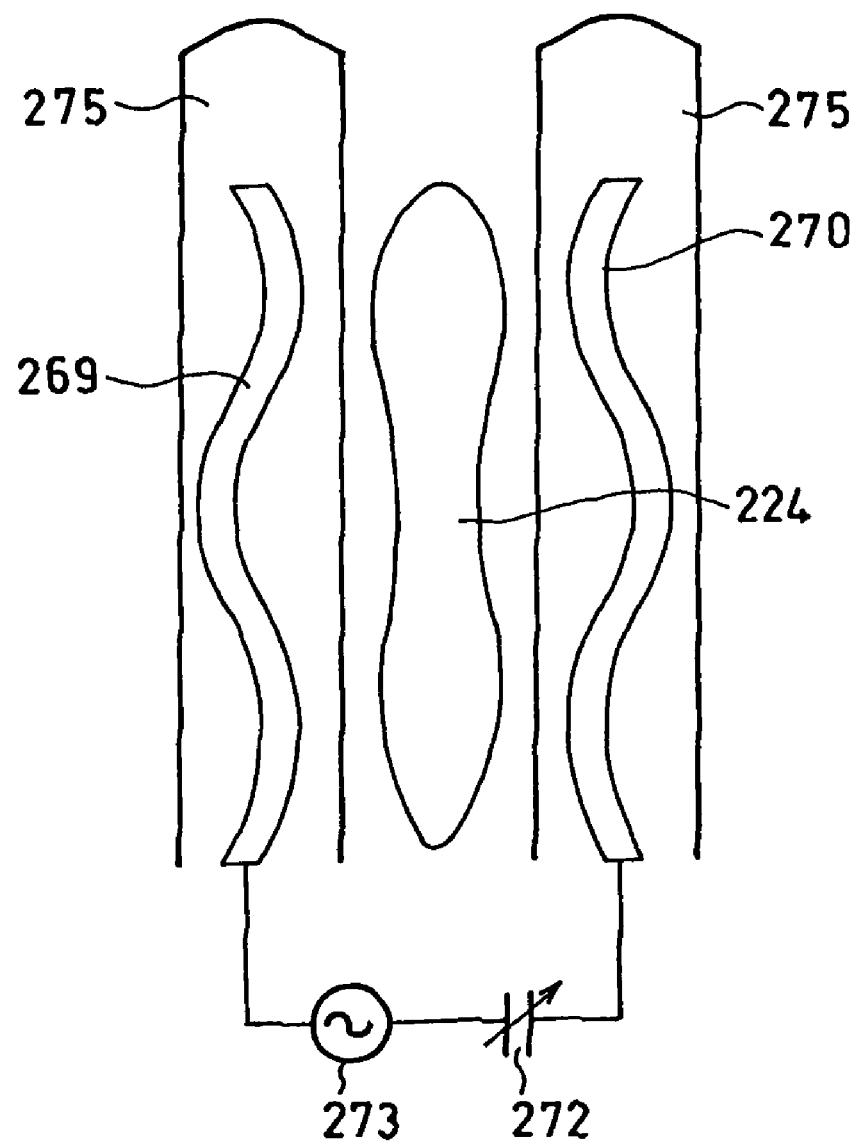
FIG. 3 is schematic view for explaining a plasma generating electrode used in the vertical substrate processing furnace of the substrate processing apparatus according to the first embodiment of the present invention.

FIG. 3 shows conductive members formed into thin plates as one example of the electrodes 269 and 270. This is the example of the electrodes 269 and 270 each using one flexible conductive member. Since the electrodes 269 and 270 are formed by machining the conductive member into thin plates, flexibility in the vertical direction is obtained on a main surface of the thin plate. Therefore, even if the reaction tube 203 is provided at its side surface with inserting-openings for the electrodes 269 and 270, the electrodes 269 and 270 can be inserted into the electrode protection tubes 275. If high frequency electricity is applied to the electrodes 269 and 270, plasma 224 can be produced. The thin electrodes 269 and 270 may be deformed in the electrode protection tubes 275, a distance between the electrodes 269 and 270 may not be constant in the vertical direction and plasma 224 may not be produced equally in some cases.

Next, an example of electrodes 269 and 270 using a plurality of flexuous conductive members will be explained with reference to FIGS. 4 and 5.

Figure 4:
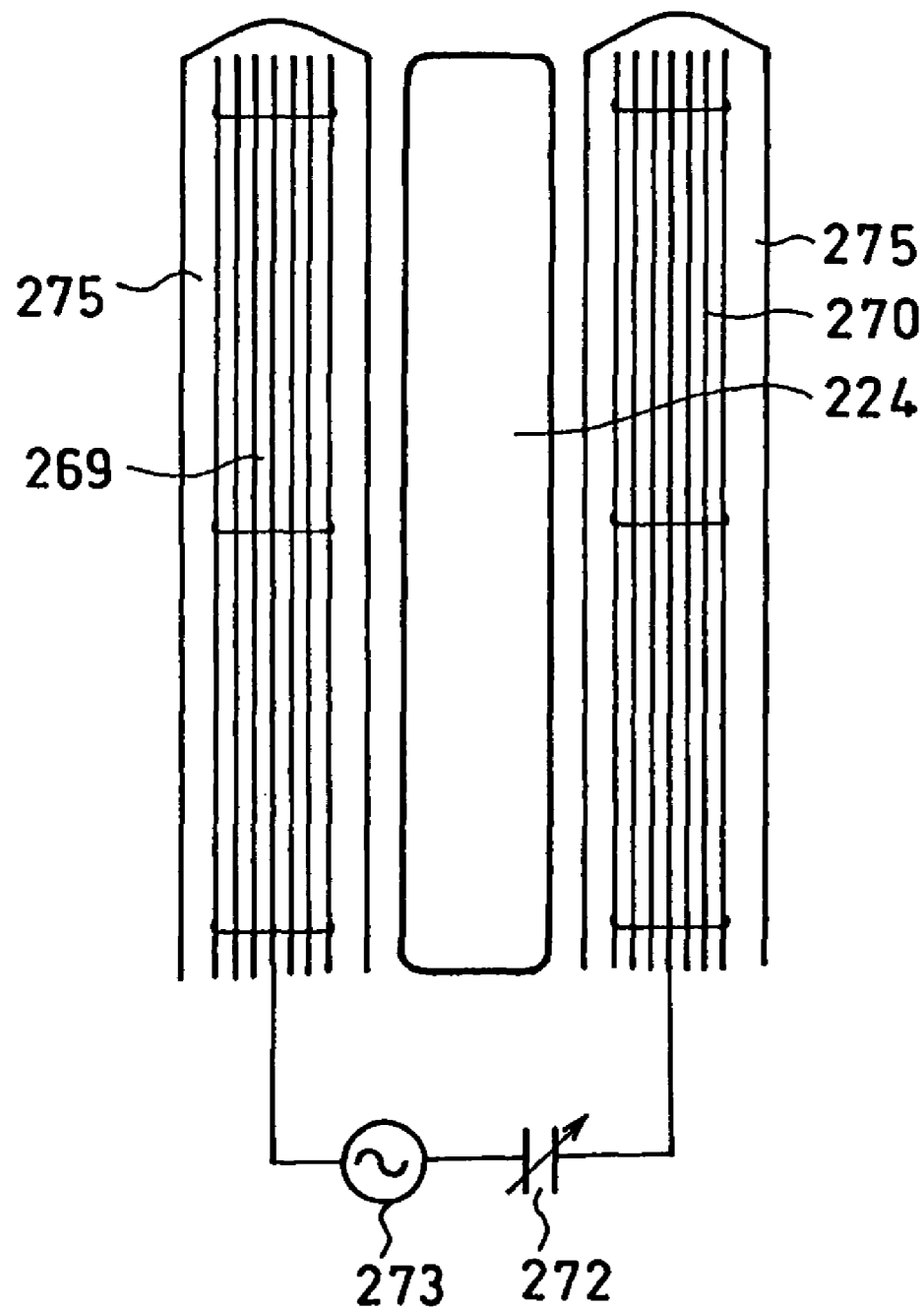
FIG. 4 is schematic view for explaining a plasma generating electrode used in the vertical substrate processing furnace of the substrate processing apparatus according to the first embodiment of the present invention.

FIG. 4 shows a structure of the electrodes 269 and 270 each formed by tying linear conductive members in a bundle. Since the electrodes 269 and 270 use the linear conductive members, flexibility and flexuous properties can be obtained.

Figure 5:
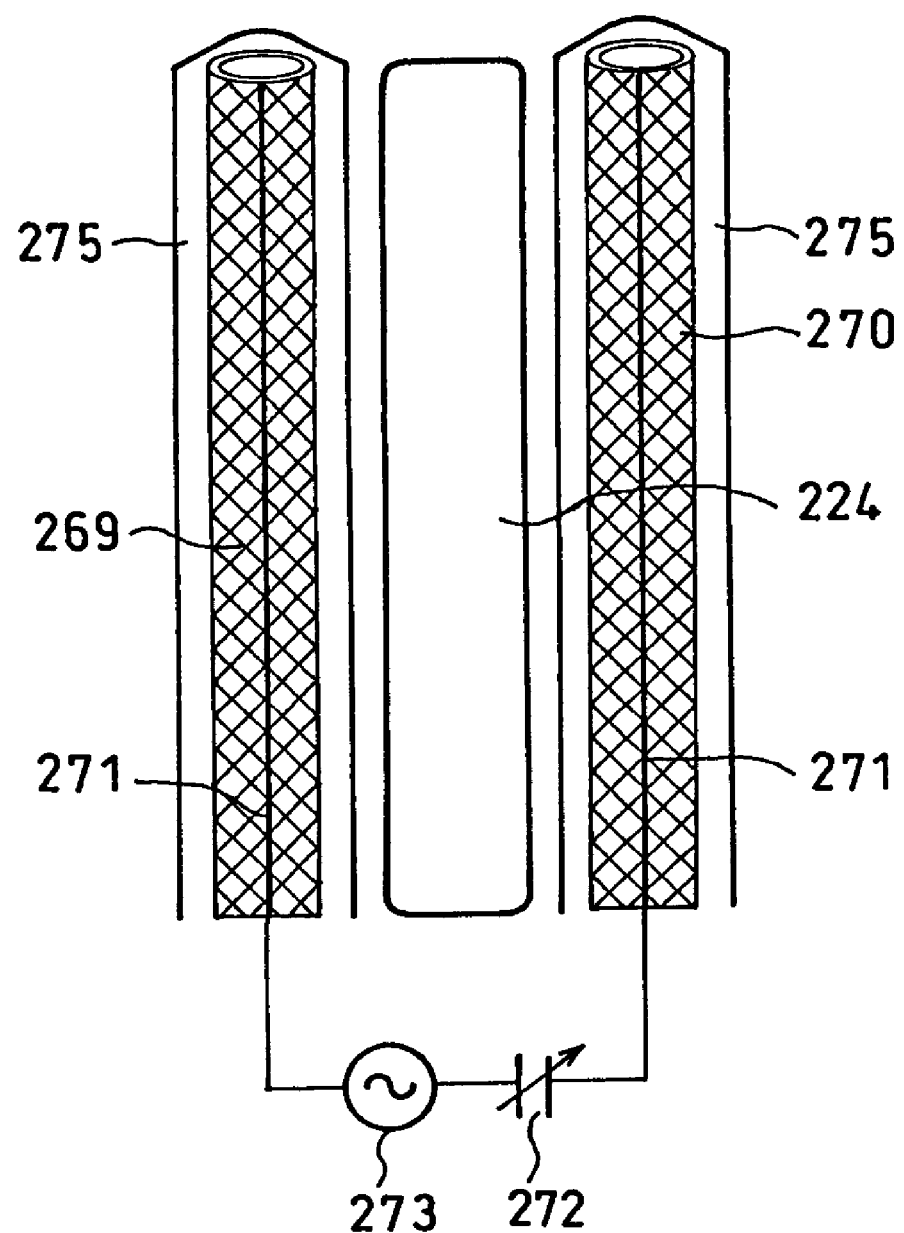
FIG. 5 is schematic view for explaining a plasma generating electrode used in the vertical substrate processing furnace of the substrate processing apparatus according to the first embodiment of the present invention.

FIG. 5 shows an example of a structure in which linear conductive members are woven. Each of the electrodes 269 and 270 has a structure in which a plurality of conductive members are woven and a core 271 is inserted therein. If the woven type electrodes 269 and 270 do not have the cores 271, the electrodes become soft when heated at the time of generation of plasma 224, the meshes are shrunk and the electrodes 269 and 270 may be shrunk downward in some cases. When electrodes 269 and 270 which are once pulled out are to be inserted into the electrode protection tubes 275 again at the time of maintenance, the softened electrodes 269 and 270 are shrunk by friction with respect to the electrode protection tubes 275 and may not reach the uppermost wafer 200 in some cases. If the electrodes 269 and 270 do not reach the uppermost wafer 200, plasma 224 is not generated or unevenly generated in a region where the plurality of wafers 200 exist, and this affects the film formation. Hence, the cores 271 are inserted into the centers of the electrodes 269 and 270 to prevent shrinkage.

Plasma 224 may not be generated in a region around the upper wafers 200. To avoid such a state, the electrodes 269 and 270 are extended upward to a level higher than the boat top 216 as shown in FIG. 1 so that plasma 224 is supplied to the uppermost wafer 200 even when the electrodes 269 and 270 are shrunk. With this structure, the electrodes 269 and 270 can be inserted to locations higher than the uppermost wafer 200, and even when the electrodes 269 and 270 are shrunk by heat, a region where plasma 224 is not generated is not generated in the region where the wafers 200 exist.

A location of the upper end of each of the electrodes 269 and 270 should be higher than the uppermost wafer 200 by a holding pitch or more of the wafer 200 held by the boat 217. Preferably, the upper end of the electrode is higher than the boat top 216 as in this embodiment.

In FIGS. 4 and 5, if the electrodes 269 and 270 have outer shapes which are smaller than an inner diameter of the electrode protection tube 275 by about 1 to 2 mm, gaps through which the electrodes 269 and 270 are inserted are formed, and gaps in which the electrodes 269 and 270 are distorted in the electrode protection tubes 275 can be eliminated. Therefore, the electrodes 269 and 270 can keep straight shapes and plasma can be generated more equally.

By employing such an electrode structure, the thin and long electrodes 269 and 270 for equally producing plasma in the reaction tube 203 can be safely used in a detachable manner.

A nozzle 233 is provided inside of the reaction tube 203 at a location away from the gas supply holes 248a through about 120°. To form films on the wafers 200 in the ALD method, a plurality kinds of gases are supplied one king by one kind alternately. At that time, the nozzle 233 is a supply section which shares the supplying operation of gas supply species with the buffer chamber 237.

Like the buffer chamber 237, the nozzle 233 also has gas supply holes 248c which are supply holes for supplying gas at the same pitch at locations adjacent to the wafers. The gas supply pipe 232b is connected to a lower portion of the nozzle 233.

When a pressure difference between the nozzle 233 and the processing chamber 201 is small, it is preferable that opening areas of the gas supply holes 248c are the same from upstream side to downstream side and the opening pitches are the same, but when the pressure difference is great, the opening areas are increased or the opening pitches are reduced toward the downstream side from the upstream side.

A controller 321 which is control means is connected to the mass flow controllers 241a and 241b, the valves 243a, 243b, 243c and 243d, the heater 207, the vacuum pump 246, a boat rotation mechanism 267, a boat elevator mechanism (not shown), the high frequency power supply 273 and the matching device 272. Adjustment of the flow rates of the mass flow controllers 241a and 241b, opening and closing operations of the valves 243a, 243b and 243c, opening and closing operations and adjustment of pressure of the valve 243d, adjustment of the temperature of the heater 207, starting and stopping operations of the vacuum pump 246, adjustment of rotation speed of the boat rotation mechanism 267, control of vertical movement of the boat elevator mechanism, control of electricity supply of the high frequency power supply 273, and impedance control by the matching device 272 are carried out.

Next, an example of film formation using the ALD method will be explained. In this example, an SiN film is to be formed using DCS and $NH_3$ gases.

First, the wafers 200 to be formed with films are set in the boat 217 and brought into the processing furnace 202. After the wafers 200 are brought into the processing furnace 202, the following four steps are carried out in succession.

[Step 1]

In step 1, $NH_3$ gas which is required for plasma excitation and DCS gas which is not required for plasma excitation are allowed to flow parallel with each other. First, the valve 243a provided in the gas supply pipe 232a and the valve 243d provided in the gas exhaust pipe 231 are opened together, thereby injecting the $NH_3$ gas whose flow rate is adjusted by the mass flow controller 241a from the gas supply pipe 232a to the buffer chamber 237. High frequency electricity of 0.1 to 0.6 kW is applied between the electrodes 269 and 270 from the high frequency power supply 273 through the matching device 272 to plasma-excite $NH_3$, and the $NH_3$ is supplied to the processing chamber 201 as active species and in this state, the gas exhaust pipe 231 is exhausted. When $NH_3$ gas is plasma-excited and allowed to flow as the active species, the valve 243d is appropriately adjusted such that the pressure in the processing chamber 201 becomes 10 to 100 Pa. The supply flow rate of $NH_3$ to be controlled by the mass flow controller 241a is 1,000 to 10,000 sccm. Time during which the wafers 200 are exposed to active species obtained by plasma-exciting $NH_3$ is 1 to 120 seconds. The temperature of the heater 207 at that time is set to 300 to 600° C. By plasma-activating $NH_3$ gas, the surface of the wafer can be processed at a low temperature.

When $NH_3$ is plasma-excited and supplied as the active species, the valve 243b located upstream from the gas supply pipe 232b is opened and the valve 243c located downstream from the gas supply pipe 232b is closed so that DCS is also allowed to flow. With this DCS is accumulated in the gas tank 247 provided between the valves 243b and 243c. At that time, gas flowing into the processing chamber 201 is active species obtained by plasma-exciting $NH_3$, and no DCS exists. Therefore, $NH_3$ does not cause vapor-phase reaction, and $NH_3$ which is plasma-excited and becomes active species surface-reacts with a foundation film on the wafer 200.

[Step 2]

In step 2, the valve 243a of the gas supply pipe 232a is closed to stop supply of $NH_3$. Then, the reaction tube 203 is purged using inert $N_2$ gas. During this operation also, supply of gas to the gas tank 247 is continued. When a predetermined amount of DCS of predetermined pressure is accumulated in the gas tank 247, the upstream valve 243b is also closed to trap DCS in the gas tank 247. The valve 243d of the gas exhaust pipe 231 is left open, the processing chamber 201 is sufficiently exhausted by the vacuum pump 246, and residual $NH_3$ is exhausted from the processing chamber 201.

[Step 3]

In step 3, if the exhausting operation in the processing chamber 201 is completed, the valve 243d of the gas exhaust pipe 231 is closed to stop the exhausting operation. The valve 243c downstream of the gas supply pipe 232b is opened. With this, DCS accumulated in the gas tank 247 is supplied to the processing chamber 201 at a dash. At that time, since the valve 243d of the gas exhaust pipe 231 is closed, the pressure in the processing chamber 201 is abruptly increased to about 931 Pa (7 Torr). Time during which DCS is supplied is set to 2 to 4 seconds, time during which the wafers are exposed to the increased pressure atmosphere is set to 2 to 4 seconds, and the total time is set to 6 seconds. The temperature of the wafer is the same as that when $NH_3$ is supplied and is 300 to 600° C. By supplying DCS, DCS causes surface reaction, H of N—H bond is replaced by Si, and an SiN film is formed on the wafer 200.

[Step 4]

In step 4, after the films are formed, the valve 243c is closed, the valve 243d is opened, the processing chamber 201 is evacuated, and gas which contributed to film formation of residue DCS is eliminated. At that time, if inert gas such as N2 is supplied to the processing chamber 201, the effect for eliminating gas which contributed to film formation of residue DCS is enhanced. The valve 243b is opened and supply of DCS to the gas tank 247 is started.

The steps 1 to 4 are defined as one cycle, and the SiN film having a predetermined thickness is formed on the wafer by repeating the cycle a plurality of times.

According to the ALD apparatus, gas is adsorbed on a surface of a foundation film. The adsorption amount of gas is proportional to pressure of gas and exposure time of gas. Therefore, in order to allow a desired certain amount of gas to adsorb in a short time, it is necessary to increase the gas pressure in a short time. In this embodiment, since DCS accumulated in the gas tank 247 is instantaneously supplied in a state where the valve 243d is closed, the pressure of DCS in the processing chamber 201 can abruptly be increased, and a desired certain amount of gas can adsorb instantaneously.

In this embodiment, while DCS is accumulated in the gas tank 247, $NH_3$ gas is plasma-excited which is a necessary step in the ALD method, thereby supplying the same as the active species and exhausting gas in the processing chamber 201. Therefore, no special step is required for accumulating DCS. Since the processing chamber 201 is exhausted, $NH_3$ gas is eliminated and then, DCS is allowed to flow. Therefore, $NH_3$ gas and DCS do not react with each other on the way to the wafers 200. The supplied DCS can effectively react only with the surfaces of the wafers 200.

Next, a reaction tube structure when electrodes 276 and 277 having no flexibility are used will be explained with reference to FIG. 6.

Figure 6:
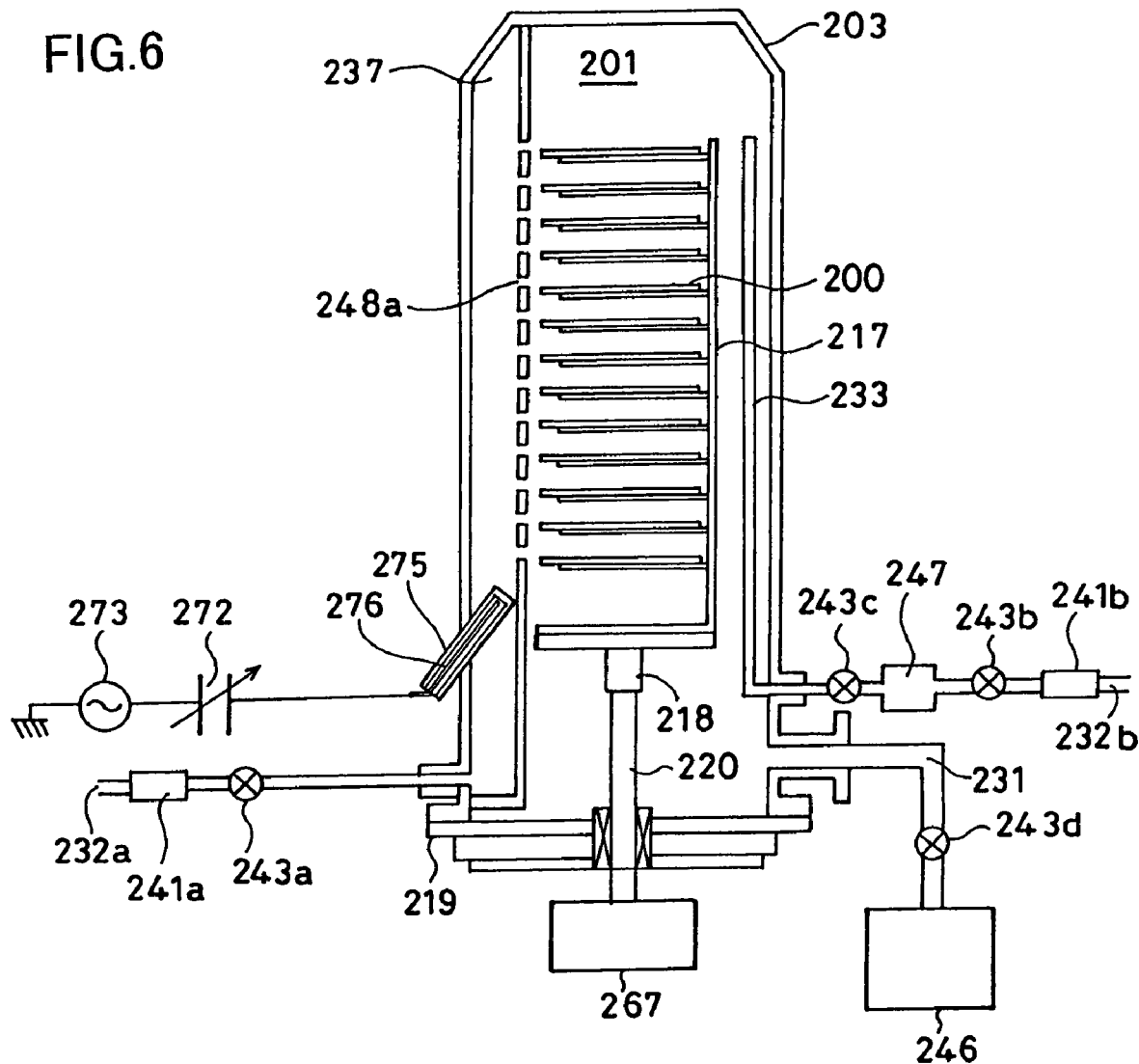
FIG. 6 is a schematic longitudinal sectional view for explaining a vertical substrate processing furnace for comparison.

When the electrode 276 is inserted from a lower side as shown in FIG. 6, the electrode 276 can be inserted only from the lower portion, and plasma can be produced only at a lower portion in the buffer chamber 237. Therefore, the processing of the wafers 200 are unevenly carried out at upper and lower portions of the boat 217.

Figure 7:
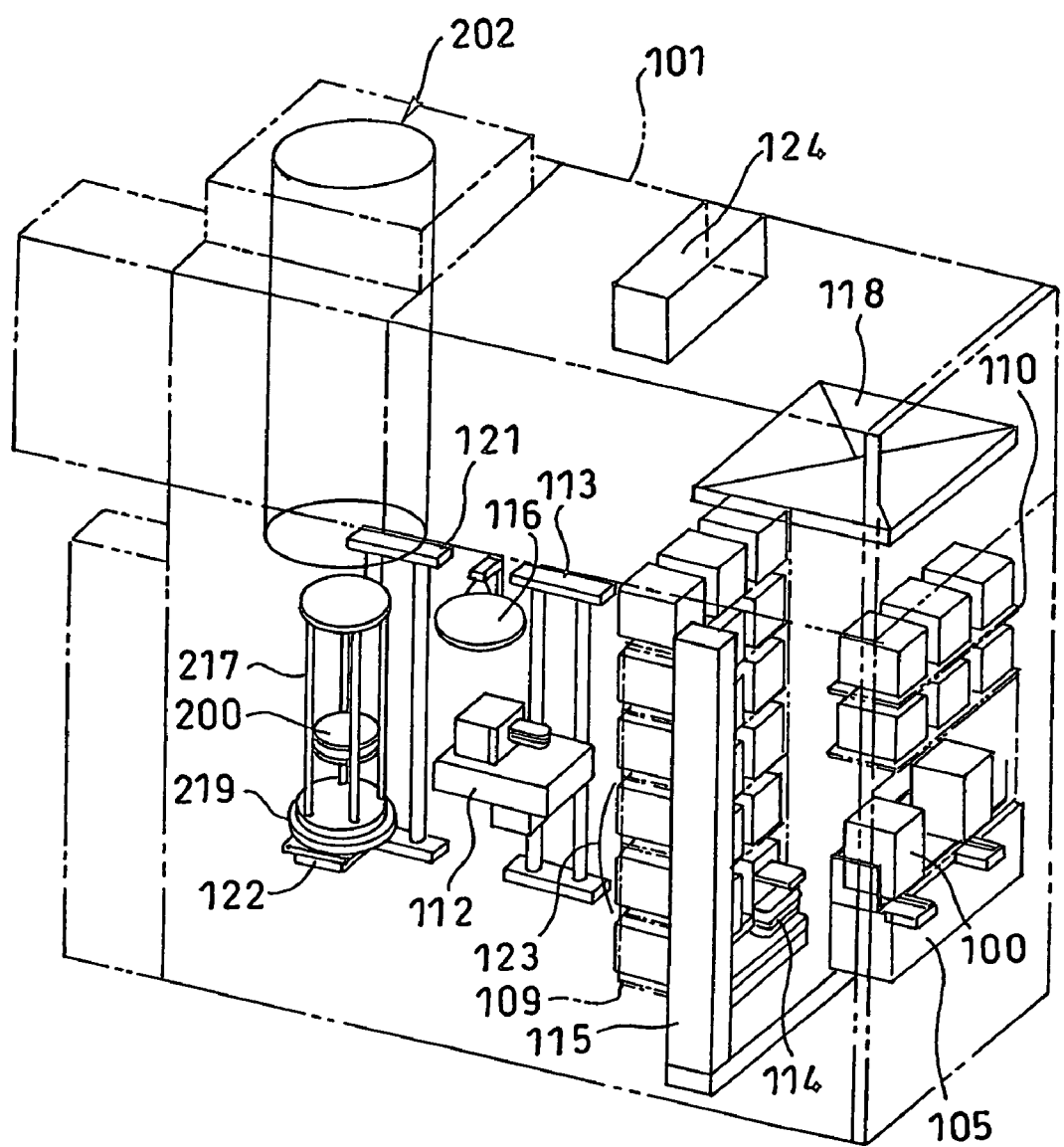
FIG. 7 is a schematic perspective view for explaining the substrate processing apparatus according to the first embodiment of the present invention.
Figure 8:
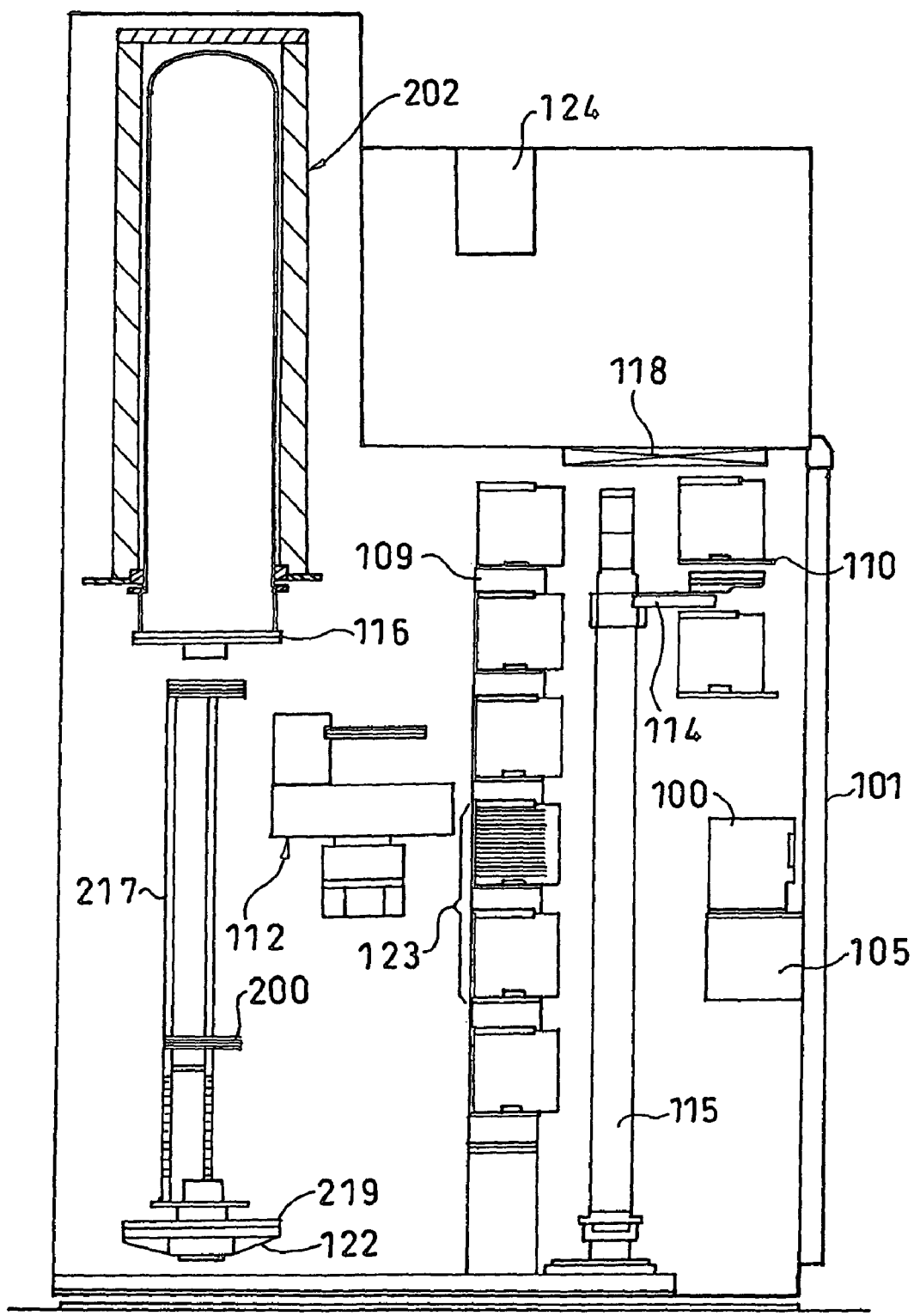
FIG. 8 is a schematic longitudinal sectional view for explaining the substrate processing apparatus according to the first embodiment of the present invention.

Next, referring to FIG. 7 and FIG. 8, an outline of the semiconductor producing apparatus which is one example of the semiconductor producing apparatus to which the present invention is preferably applied will be explained.

A cassette stage 105 as a holding tool delivery member which deliveries a cassette 100 as a substrate accommodating container between a casing 101 and an external transfer apparatus (not shown) is provided on a front surface side in the casing 101. A cassette elevator 115 as elevator means is provided on a rear side of the cassette stage 105. A cassette loader 114 as transfer means is mounted on the cassette elevator 115. A cassette shelf 109 as placing means of the cassette 100 is provided on the rear side of the cassette elevator 115, and an auxiliary cassette shelf 110 is provided also above the cassette stage 105. A clean unit 118 is provided above the auxiliary cassette shelf 110 so that clean air can flow into the casing 101.

The processing furnace 202 is provided above a rear portion of the casing 101. A boat elevator 121 as elevator means is provided below the processing furnace 202. The boat elevator 121 vertically moves the boat 217 as the substrate holding means to and from the processing furnace 202. The boat 217 holds the wafers 200 as substrates in the multi-stacked manner in their horizontal attitudes. The seal cap 219 as a lid is mounted on a tip end of a vertically moving member 122 which is mounted on the boat elevator 121, and the seal cap 219 vertically supports the boat 217. A loading elevator 113 as elevator means is provided between the boat elevator 121 and the cassette shelf 109. A wafer loader 112 as transfer means is mounted on the loading elevator 113. A furnace opening shutter 116 as a shielding member is provided by the side of the boat elevator 121. The furnace opening shutter 116 has an opening/closing mechanism and closes a lower surface of the processing furnace 202.

The cassette 100 in which the wafers 200 are rotated through 90° by the cassette stage 105 such that wafers 200 are brought into the cassette stage 105 from an external transfer apparatus (not shown) and the wafers 200 assume the horizontal attitudes. The cassette 100 is transferred to the cassette shelf 109 or the auxiliary cassette shelf 110 from the cassette stage 105 by cooperation of vertical movement and lateral movement of the cassette elevator 115 and forward and backward movement and rotational movement of the cassette loader 114.

The cassette shelf 109 includes a transfer shelf 123 in which cassette 100 to be transferred by the wafer loader 112 is accommodated. The cassette 100 on which the wafers 200 are set is transferred to the transfer shelf 123 by the cassette elevator 115 and the cassette loader 114.

If the cassette 100 is transferred to the transfer shelf 123, the wafers 200 are loaded on the boat 217 which is lowered from the transfer shelf 123 by cooperation of forward and backward motion and rotational motion of the wafer loader 112 and vertical motion of the loading elevator 113.

If a necessary number of wafers 200 are loaded on the boat 217, the boat 217 is inserted into the processing furnace 202 by the boat elevator 121, and the processing furnace 202 is air-tightly closed with the seal cap 219. In the air-tightly closed processing furnace 202, the wafers 200 are heated, processing gas is supplied into the processing furnace 202, and the wafers 200 are processed.

If the processing of the wafers 200 is completed, the wafers 200 are moved to the cassette 100 of the transfer shelf 123 from the boat 217 following the above procedure in reverse, the cassette 100 is moved to the cassette stage 105 from the transfer shelf 123 by the cassette loader 114, and is transferred out from the casing 101 by the external transfer apparatus (not shown). In the state in which the boat 217 is lowered, the furnace opening shutter 116 closes the lower surface of the processing furnace 202 to prevent outside air from entering into the processing furnace 202.

The transfer motions of the cassette loader 114 and the like are controlled by transfer control means 124.

The entire disclosure of Japanese Patent Application No. 2004-55446 filed on Feb. 27, 2004 including specification, claims, drawings and abstract are incorporated herein by reference in its entirety.

Although various exemplary embodiments have been shown and described, the invention is not limited to the embodiments shown. Therefore, the scope of the invention is intended to be limited solely by the scope of the claims that follow.

INDUSTRIAL APPLICABILITY

According to the preferred embodiment of the present invention, as explained above, it is possible to provide a substrate processing apparatus capable of equally generating plasma, and having an electrode which can easily be attached to the apparatus.

As a result, the present invention can especially preferably be utilized for a substrate processing apparatus which form a film on a semiconductor wafer using plasma-excited processing gas.

The invention claimed is:

1. A substrate processing apparatus, comprising:
   a processing chamber which is to accommodate at least one substrate;
   a gas supply system which is to supply processing gas into the processing chamber;
   an exhaust system which is to exhaust atmosphere in the processing chamber; and
   at least one pair of electrodes which are to bring the processing gas into an active state, the electrodes being accommodated in protection tubes such that the electrodes can be inserted into and pulled out from the protection tubes, wherein
   the electrodes are accommodated in the protection tubes in a state where at least a portion of each of the electrodes is bent, and the electrodes are formed of linear conductive members that are either woven together or that are tied together in bundles.

2. A substrate processing apparatus as recited in claim 1, wherein each of the electrodes is formed of linear conductive members that are woven together and formed into a hollow cylinder.

3. A substrate processing apparatus as recited in claim 2, wherein
the electrodes that are each formed into a hollow cylinder are provided with cores, respectively.

4. A substrate processing apparatus as recited in claim 1, wherein
the substrate processing apparatus is an apparatus wherein processing of the substrates are carried out in a state where a substrate holding member which holds a plurality of substrates in a multi-stacked manner at a predetermined distance from each other is accommodated in the processing chamber, and
the pair of electrodes are disposed along a stacking direction of the substrates, and ends of the electrodes are located at a position exceeding a position of a leading end substrate, which is held by the substrate holding member which is located on the side of the ends of the electrodes, by at least a length corresponding to the distance between adjacent substrates in the substrate holding member.

5. A substrate processing apparatus as recited in claim 4, wherein
the ends of the electrodes are located at a position exceeding a position of a top plate of the substrate holding member.

6. A substrate processing apparatus as recited in claim 1, wherein
the pair of electrodes are accommodated in separate protection tubes, respectively, such that the electrodes can be inserted into and pulled out from the protection tubes, respectively.

7. A substrate processing apparatus as recited in claim 1, wherein
an outer diameter of each of the pair of electrodes is smaller than an inner diameter of each of the separate protection tubes by 1 mm to 2 mm.

8. A semiconductor device producing method, comprising: processing at least one substrate using a substrate processing apparatus, comprising:
a processing chamber which is to accommodate at least one substrate;
a gas supply system which is to supply processing gas into the processing chamber;
an exhaust system which is to exhaust atmosphere in the processing chamber; and
at least one pair of electrodes which are to bring the processing gas into an active state, the electrodes being accommodated in protection tubes such that the electrodes can be inserted into and pulled out from the protection tubes, wherein
the electrodes are accommodated in the protection tube in a state where at least a portion of the electrodes is bent, and the electrodes are formed as linear conductive members that are either woven together or that are tied together in bundles.

9. A substrate processing apparatus, comprising:
a processing chamber with a support that holds at least one substrate in a manner to provide processing of the substrate in the processing chamber;
a gas supply system operable to supply processing gas into the processing chamber;
an exhaust system operable to exhaust atmosphere from the processing chamber; and
at least one pair of electrodes operable to bring the processing gas in the processing chamber into an active state to process the substrate in the processing chamber, each of the electrodes being provided in an associated protection tube such that each of the electrodes can be inserted into and pulled out from the associated protection tube, wherein
each of the electrodes is flexible and is formed as linear conductive members that are either woven together or that are tied together in bundles, the electrodes being accommodated in the associated protection tube in a state where at least a portion of each of the electrodes is bent.

10. A substrate processing apparatus as recited in claim 9, wherein
each of the electrodes is formed of linear conductive members that are woven together and formed into a hollow cylinder.

11. A substrate processing apparatus as recited in claim 10, wherein
the electrodes that are each formed into a hollow cylinder are provided with cores.

12. A substrate processing apparatus as recited in claim 9, wherein
the substrate processing apparatus is operative to process a plurality of substrates held by the support formed as a substrate holding member in the processing chamber, the substrate holding member holding the plurality of substrates at a predetermined distance from each other along a holding direction extending from a first held substrate to a final held substrate, and
each of the electrodes in the associated tubes are disposed along the holding direction of the substrates in proximity to the held substrates with respective ends of the electrodes extending in the holding direction past a position in alignment with the final substrate by at least a length in the holding direction corresponding to the predetermined distance.

13. A substrate processing apparatus as recited in claim 12, wherein
the holding direction is a vertical direction and the final substrate is at the top of the plurality of substrates that are stacked vertically by the substrate holding member.

14. A substrate processing apparatus as recited in claim 9, wherein
an outer diameter of each of the electrodes is smaller than an inner diameter of each of the associated protection tubes by 1 mm to 2 mm.

* * * * *